US009471518B2

(12) United States Patent
Amirkhany et al.

(10) Patent No.: US 9,471,518 B2
(45) Date of Patent: Oct. 18, 2016

(54) MULTI-MODAL MEMORY INTERFACE

(71) Applicant: Rambus Inc., Sunnyvale, CA (US)

(72) Inventors: Amir Amirkhany, Sunnyvale, CA (US); Wendemagegnehu Beyene, San Jose, CA (US)

(73) Assignee: Rambus Inc., Sunnyvale, CA (US)

( * ) Notice: Subject to any disclaimer, the term of this patent is extended or adjusted under 35 U.S.C. 154(b) by 142 days.

(21) Appl. No.: 13/667,520

(22) Filed: Nov. 2, 2012

(65) Prior Publication Data
US 2013/0114363 A1    May 9, 2013

Related U.S. Application Data

(60) Provisional application No. 61/555,416, filed on Nov. 3, 2011.

(51) Int. Cl.
*G06F 13/16* (2006.01)
*G11C 7/10* (2006.01)

(52) U.S. Cl.
CPC ......... *G06F 13/1668* (2013.01); *G11C 7/1057* (2013.01); *G11C 7/1084* (2013.01)

(58) Field of Classification Search
None
See application file for complete search history.

(56) References Cited

U.S. PATENT DOCUMENTS

| 6,703,866 | B1 * | 3/2004 | Arimilli et al. ............... 326/86 |
| 7,221,613 | B2 * | 5/2007 | Pelley et al. ............ 365/230.03 |
| 2008/0034378 | A1 | 2/2008 | Kumar et al. ............... 719/321 |
| 2008/0189457 | A1 * | 8/2008 | Dreps et al. ............... 710/106 |
| 2009/0190639 | A1 | 7/2009 | Ruha et al. ................. 375/222 |
| 2010/0164539 | A1 * | 7/2010 | Balamurugan et al. ........ 326/30 |

* cited by examiner

*Primary Examiner* — Kretelia Graham
(74) *Attorney, Agent, or Firm* — Lance Kreisman; Peninsula Patent Group

(57) ABSTRACT

A multi-modal memory interface that supports each of current-mode and voltage-mode signaling by a memory controller with a memory which includes one or more memory devices. In a first type of system, the memory interface is configured to provide differential current-mode signaling from the memory controller to a first type of memory, and differential voltage-mode signaling from the memory to the memory controller. In contrast, in a second type of system, the memory interface is configured to provide single-ended voltage-mode signaling from the memory controller to the memory, and single-ended voltage-mode signaling from a second type of memory to the memory controller. To support these different types of systems, the memory controller couples different types of drivers to each I/O pad. The resulting capacitance is reduced by sharing components between these drivers. Moreover, in some embodiments, the memory interface is implemented using "near-ground" current-mode and voltage-mode signaling techniques.

20 Claims, 14 Drawing Sheets

MULTI-MODAL MEMORY INTERFACE

CROSS-REFERENCE TO RELATED APPLICATIONS

This application claims the benefit of priority under 35 U.S.C. 119(e) to Provisional Application Ser. No. 61/555,416, filed Nov. 3, 2011, titled MULTI-MODAL MEMORY INTERFACE, which is incorporated herein by reference in its entirety.

BACKGROUND

1. Field

The disclosed embodiments generally relate to the design of memory systems for computers. More specifically, the disclosed embodiments relate to the design of a multi-modal memory interface that supports both current-mode and voltage-mode signaling.

2. Related Art

Memory systems are beginning to use differential signaling techniques to achieve higher performance and better power efficiency than can be achieved through using conventional single-ended signaling techniques. In order to provide a smooth transition path toward memory systems that use differential signaling, it is advantageous to provide multi-modal memory controllers which are able to support both types of signaling. In this way, processor manufacturers can produce a single processor chip (and associated chip package) to provide a memory controller that can be used with memory devices that support either differential or single-ended signaling.

However, because of the incompatible voltage and swing levels for standard single-ended memories (>1.2V supply and >600 mV swing) and high-end differential memories (<1.2V supply and <600 mV swing), a multi-modal memory controller often must connect at least two different I/O drivers to the same I/O pad. Unfortunately, this creates additional capacitance, which can adversely affect high-speed signaling performance. Hence, it is desirable to be able to minimize the amount of capacitance associated with an I/O pad that is coupled to multiple I/O drivers.

DETAILED DESCRIPTION

Figure 1:
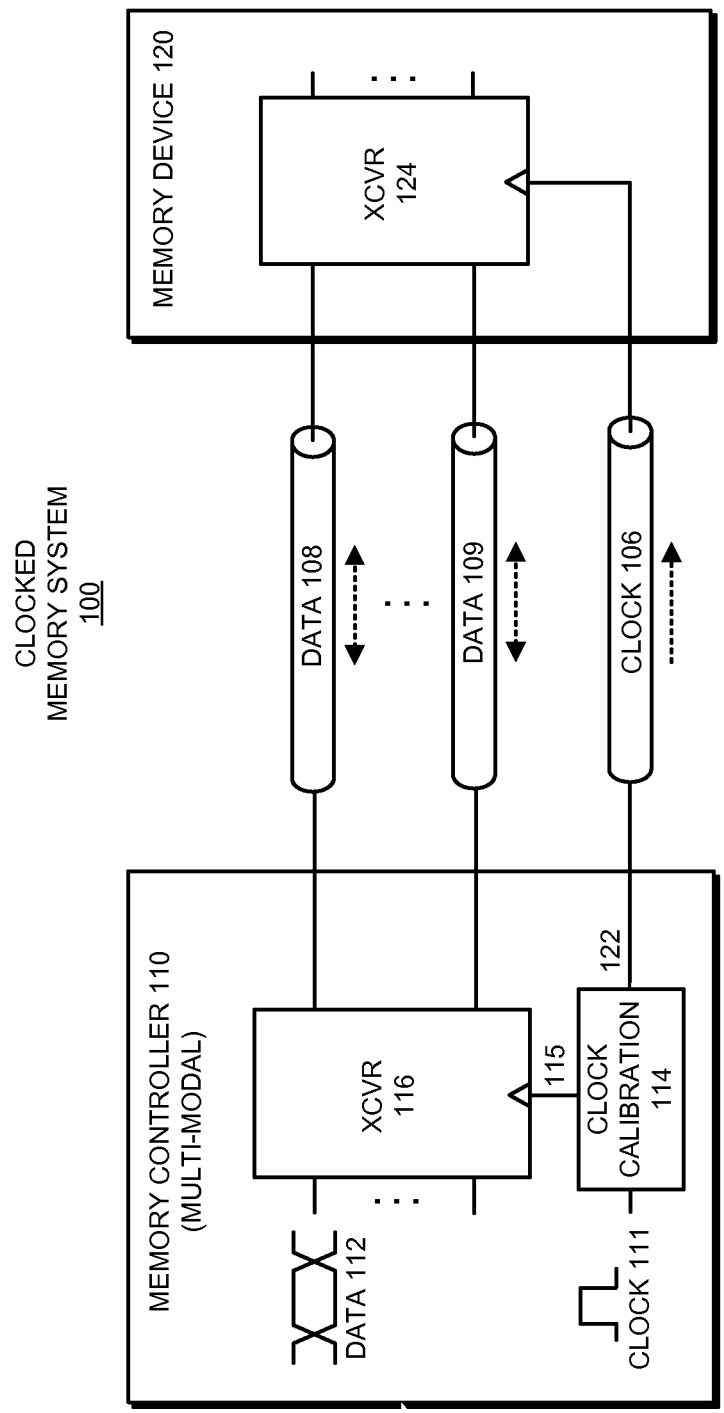
FIG. 1 illustrates a clocked memory system in accordance with disclosed embodiments.

The disclosed embodiments relate to the design of a multi-modal memory interface that supports both current-mode and voltage-mode signaling between a memory controller and a memory which includes one or more memory devices. Voltage-mode drivers can be more power-efficient than current-mode drivers, but the additional supporting circuitry to provide calibration and equalization operations can mitigate this power advantage. In contrast, differential current-mode drivers are less power-efficient, but the supporting circuitry for calibration and equalization operations does not affect power efficiency as much. Hence, it is sometimes desirable to use voltage-mode drivers when a simple implementation is required without the need for calibration or equalization circuitry, and it is desirable to use current-mode drivers when a more complex implementation can be provided which includes calibration and equalization circuitry (and where system design can accommodate this circuitry example at the memory controller).

In a first type of system provided by this disclosure, the memory interface is configured to provide differential current-mode signaling (e.g., where communications are sent by the memory controller to the memory), and differential voltage-mode signaling in the other direction (e.g., where communications are sent from the memory to the memory controller). That is to say, where signaling paths are bidirectional, one direction of communication can be rooted in current-mode signaling, while communication sent the return direction can be rooted in voltage-mode signaling techniques. Thus, the memory interface at each end can be "asymmetric;" this ultimately permits complexity to be moved to the memory controller (where more circuit real estate and faster transistors are available) and the memory device (where less circuit real estate is available) remains simple.

In a second type of system provided by this disclosure, the memory interface is configured to provide, single-ended voltage-mode signaling from the memory controller to a memory, and single-ended voltage-mode signaling from said memory to the memory controller.

Note that one embodiment disclosed herein provides a bimodal memory controller, that is, a single memory controller design that can be used both with memory devices of "type A" (e.g., memory devices used in the first type of system above, where a newer memory device type uses differential voltage mode techniques to communicate with the bimodal memory controller) and with memory devices of "type B" (e.g., memory devices used in the second type of system above, where a legacy memory device uses singled ended techniques to communicate with the same bimodal memory controller).

To support these different types of systems, an embodiment of this memory controller couples different types of drivers to each I/O pad. However, the resulting capacitance is reduced by sharing components between these drivers. For example, in one embodiment, a differential current-mode driver and a single-ended voltage-mode driver are configured to share pull-down resistors, which reduces the capacitance at the I/O pad.

In some embodiments, the memory interface can also be implemented using "near-ground" current-mode signaling in the WRITE direction, and "near-ground" voltage-mode signaling in the READ direction. Note that using near-ground signaling facilitates using a supply voltage for memory-interface circuitry at the controller, $V_{DDIO}$, which differs from a supply voltage for memory-interface circuitry at the memory, $V_{REG}$.

These multi-modal memory interfaces are described in more detail below in the context of a clocked memory system that supports high-speed data transfers between a memory controller and a memory.

Clocked Memory System

Referring to FIG. 1, an exemplary clocked memory system 100 includes a memory controller 110 which communicates with at least one memory device 120 through bi-directional data paths 108-109 and a clock path 106. In one embodiment, memory device 120 can include a memory module, and in another embodiment, memory device 120 can include a dynamic random access memory (DRAM) integrated circuit. Also note that memory controller 110 if desired can be a multi-modal memory controller as introduced above, that is, that supports both voltage-mode and current-mode signaling. To this end, the memory controller 110 can include control logic 118 including a register 119, where a transceiver (XCVR) 116 is configured for voltage-mode signaling in response to a first register value, and for current-mode signaling in response to a second register value. Clocked memory system 100 can generally be incorporated into any type of computing device or computing system which includes a processor and a memory, such as a server computer system, a desktop computer system, a portable laptop computer system, a tablet computer system, or a computer system within a smartphone. Moreover, clocked memory system 100 can include any type of memory system which supports specific memory interface standards, such as Graphics Double Data Rate 4 (GDDR4), Graphics Double Data Rate 5 (GDDR5), Rambus DRAM (RDRAM) and extreme data rate DRAM (XDR DRAM).

During operation of clocked memory system 100, data signals 112 are transferred between transceiver (XCVR) 116 on controller 110 and a corresponding transceiver (XCVR) 124 on memory device 120 through data path 108. More specifically, during write operations, data is transmitted from transceiver 116 in controller 110 to transceiver 124 in memory device 120. Similarly, during read operations, data is transferred in the other direction from transceiver 124 in memory device 120 to transceiver 116 in controller 110.

These data transfers are synchronized with reference to a clock signal 111, which feeds into a calibration circuit 114 in controller 110. Calibration circuit 114 generates a controller clock signal 115 which feeds into XCVR 116 and also a memory clock signal 122 which feeds through clock path 106 to XCVR 124 within memory device 120.

As illustrated in FIG. 1 clocked memory system 100 includes multiple data paths 108-109 for each clock path 106, wherein data paths 108-109 include circuitry that supports per-path phase adjustment for each of the transmit and receive directions.

Multi-Modal Circuitry with Near-Ground Signaling

Figure 2A:
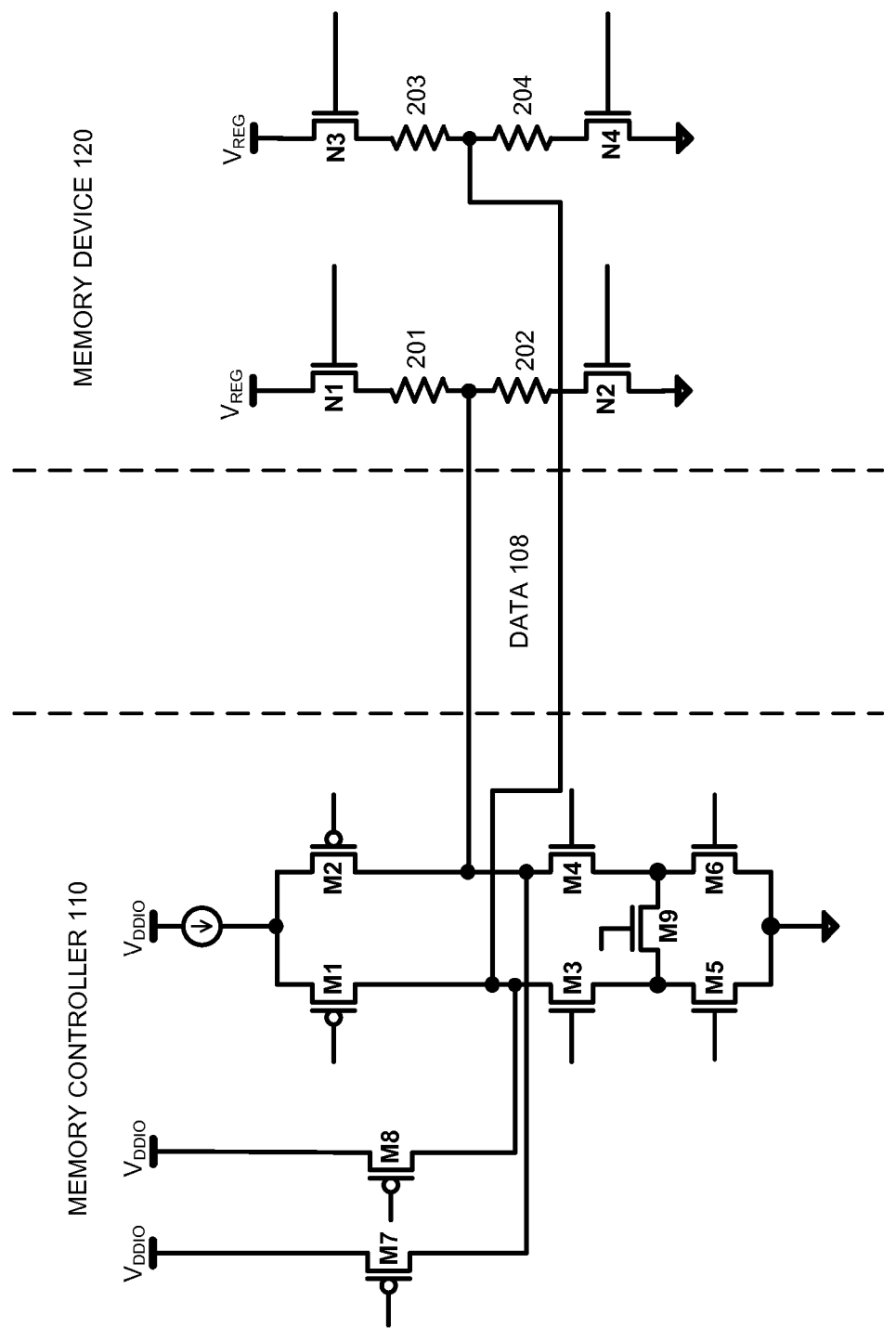
FIG. 2A illustrates multi-modal signaling circuitry which uses near-ground signaling in accordance with disclosed embodiments.

FIG. 2A illustrates signaling circuitry which uses near-ground signaling in accordance with the disclosed embodiments. Note that this "near-ground" signaling allows the supply voltage $V_{DDIO}$ for memory-interface circuitry at the controller to differ from the supply voltage $V_{REG}$ for memory-interface circuitry at the memory device 120. This makes it possible for the power consumption of the memory controller 110 to be optimized independently of the constraints on the memory device. In addition, memory controller 110 can operate with a number of different types of memory devices, which is advantageous because a number of recent technological advances that facilitate power savings are causing controller voltages and memory voltages to decrease.

In a first type of system, the circuitry illustrated in FIG. 2A performs differential current-mode write operations, wherein data is transferred from memory controller 110 to memory device 120, and differential voltage-mode read operations, wherein data is transferred in the other direction from memory device 120 to memory controller 110.

Figure 2B:
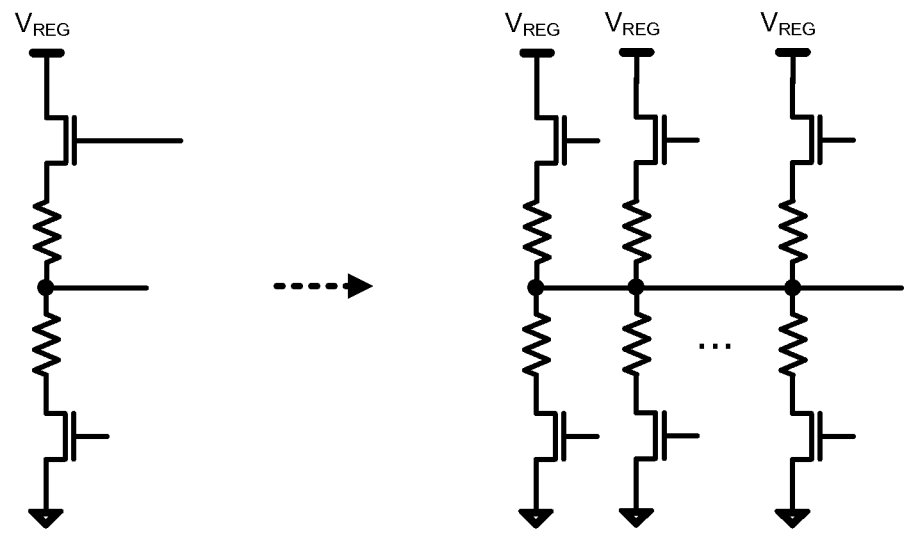
FIG. 2B illustrates a pull-down termination network comprised of multiple slices in accordance with disclosed embodiments.
Figure 2C:
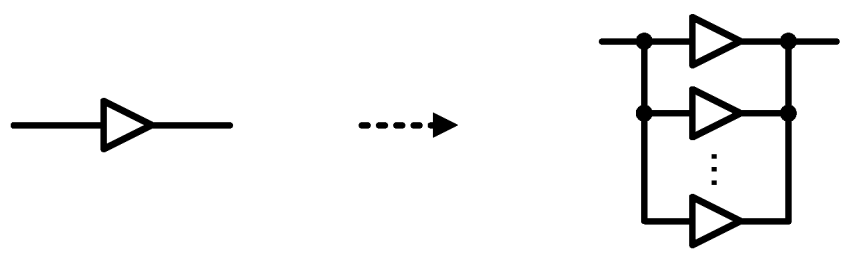
FIG. 2C illustrates a driver comprised of multiple slices in accordance with disclosed embodiments.
Figure 2D:
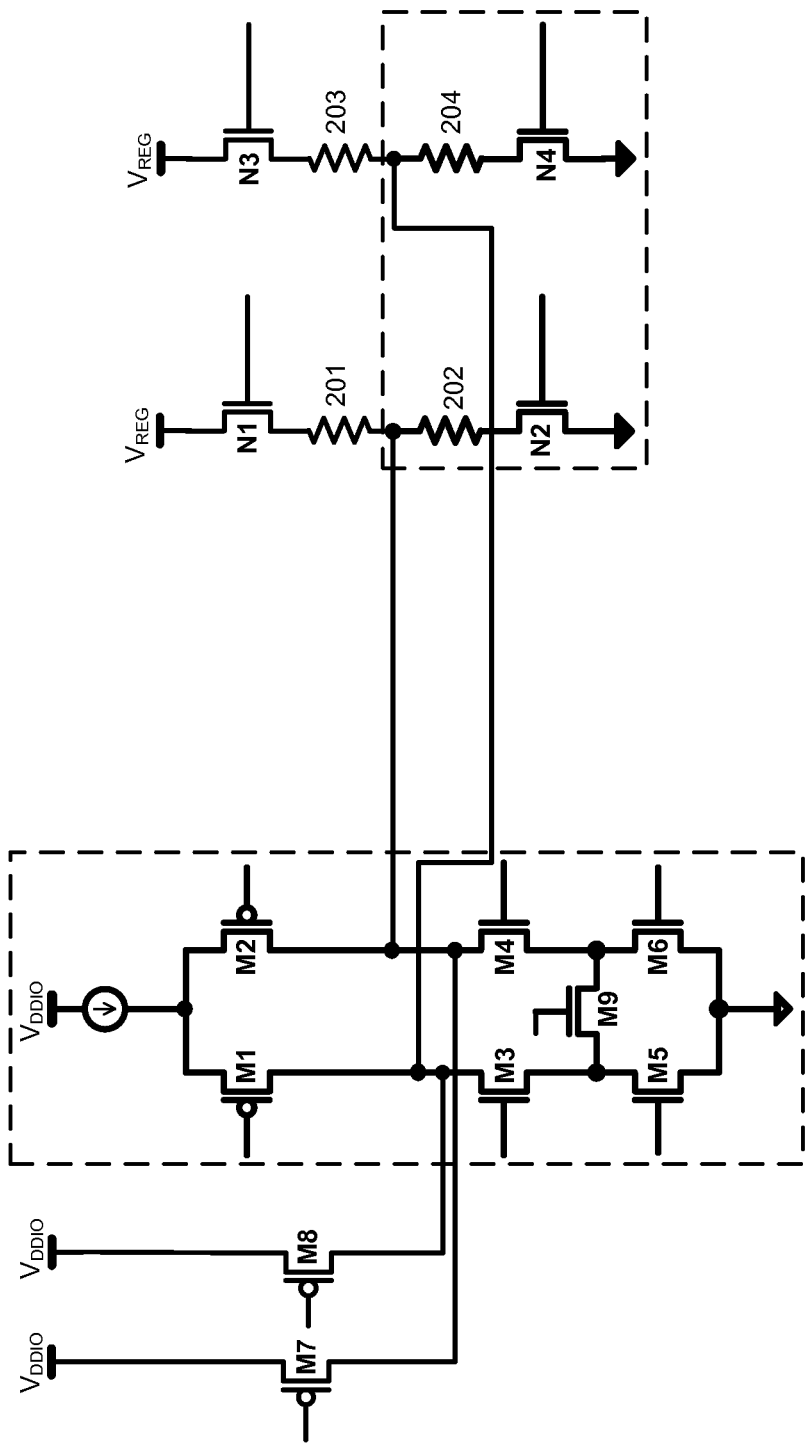
FIG. 2D illustrates the multi-modal circuitry with differential write circuitry highlighted in accordance with disclosed embodiments.

More specifically, referring to FIG. 2D, during a differential current-mode write operation, P-type transistors M1 and M2 function as a differential pair. At the same time, N-type transistors M3, M4, M5 and M6 are controlled (e.g., so as to operate in their Ohmic modes) as resistors for the differential driver; N-type transistors M3 and M5 are coupled in series to form a first pull-down resistance, and N-type transistors M4 and M6 are coupled in series to form a second pull-down resistance. Note that N-type transistor M9 is turned off. Also note that the system can include additional poly resistors to supplement the resistance provided by N-type transistors M2, M3, M4 and M5. The pull-down termination network can also comprise multiple slices to implement impedance calibration as is illustrated in FIG. 2B.

Note that there are at least two different embodiments for adjustable impedance represented by the circuit of FIG. 2A; first, each NFET (M3-M6, M9) can be controlled using an analog voltage, to cause the associated transistor to operate in its Ohmic range and thus provide tailored resistance—in such an embodiment, the control voltage can be a value that is calibrated to produce the desired resistance. The adjustable impedance can also be digitally provided, for example, through multiple slices in parallel as seen in FIG. 2B. That is, each slice can be turned on or off to digitally provide parallel resistances and so effect adjustable impedance. A combination of these techniques can also be used. For example, the differential pair M1-M2 and the current source can also use multiple slices as respective taps to implement equalization as is illustrated in FIG. 2C, that is, where each equalization "leg" 205 represents a separate driver or tap that each may be adjusted for impedance and driven according to a respective equalization coefficient (or collectively to provide a different equalization effect). Each such "leg" or "tap" can be implemented using the circuitry depicted at the left-hand side of FIG. 2A, with respective outputs being summed together for current-mode write operations.

Referring to FIG. 2D, on the memory device side, N-type transistors N1 and N3 are turned off and resistor 202 is coupled in series with N-type transistor N2 to provide a first termination resistance. Similarly, resistor 204 is coupled in series with N-type transistor M4 to form a second termination resistance. Note that resistors 202 and 204 and N-type transistors N2 and N4 have a dual use in this circuit. First, they function as part of the voltage-mode driver on memory device 120 during a voltage-mode read operation, wherein data is transferred from memory device 120 to memory controller 110. Second, they also function as termination resistances during a differential current-mode write operation, where data is transferred from memory controller 110 to the memory device 120.

Figure 2E:
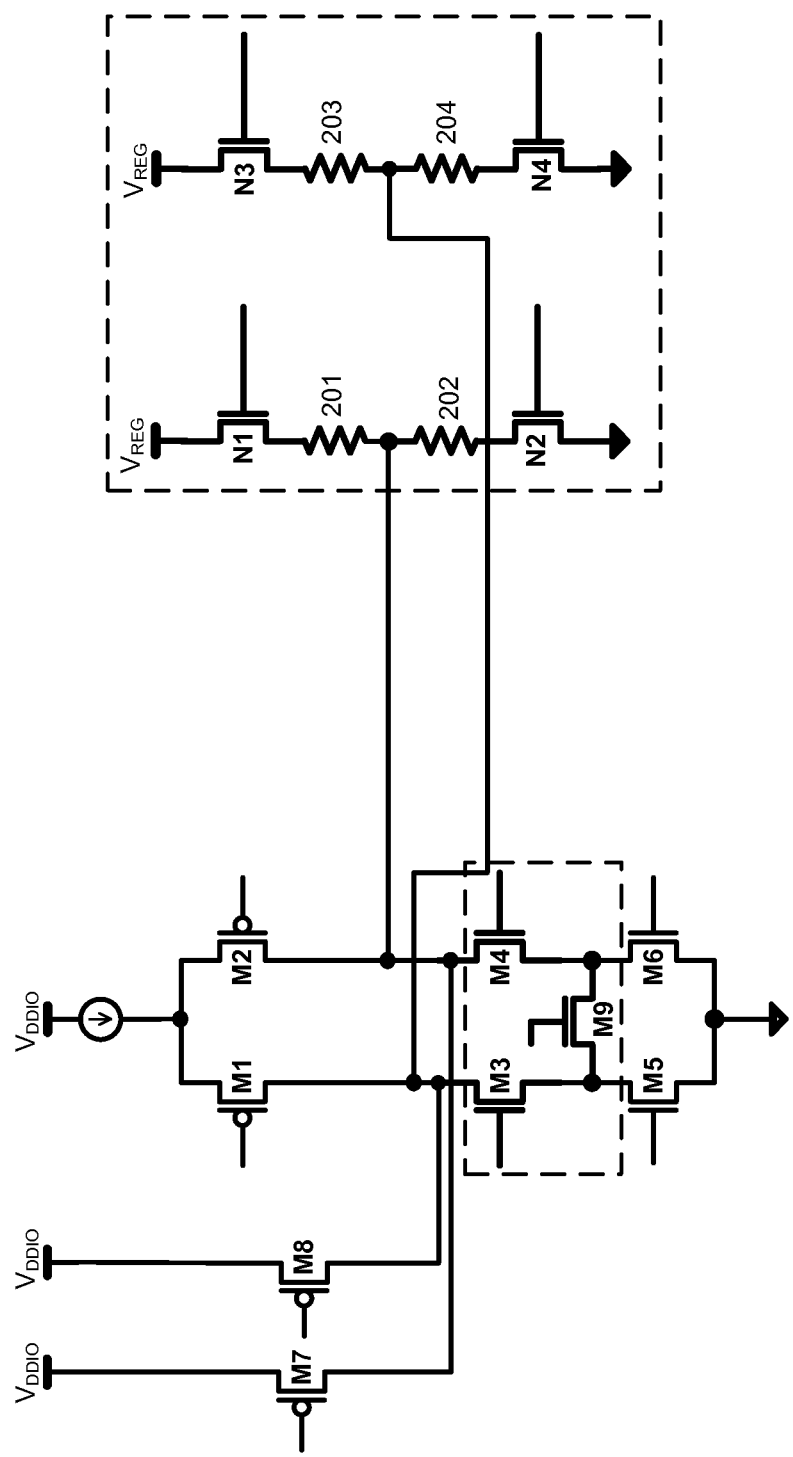
FIG. 2E illustrates the multi-modal circuitry with differential read circuitry highlighted in accordance with disclosed embodiments.

Referring to FIG. 2E, during a differential voltage-mode transmission of read data from memory device 120, N-type transistors N1-N2 and resistors 201-202 function as a driver, and N-type transistors N3-N4 and resistors 203-204 function as a complementary driver. On the controller side, N-type transistors M3, M4 and M9 are biased to operate as resistors and are coupled in series to form a termination resistance (for example, proving a 100 Ohm resistance) which terminates the differential signals received from memory device 120. Note that resistors 201-204 may similarly be implemented using biased transistors. Furthermore, the pull-down termination network in memory device 120 may comprise multiple slices similar to what is shown in FIG. 2B.

Figure 2F:
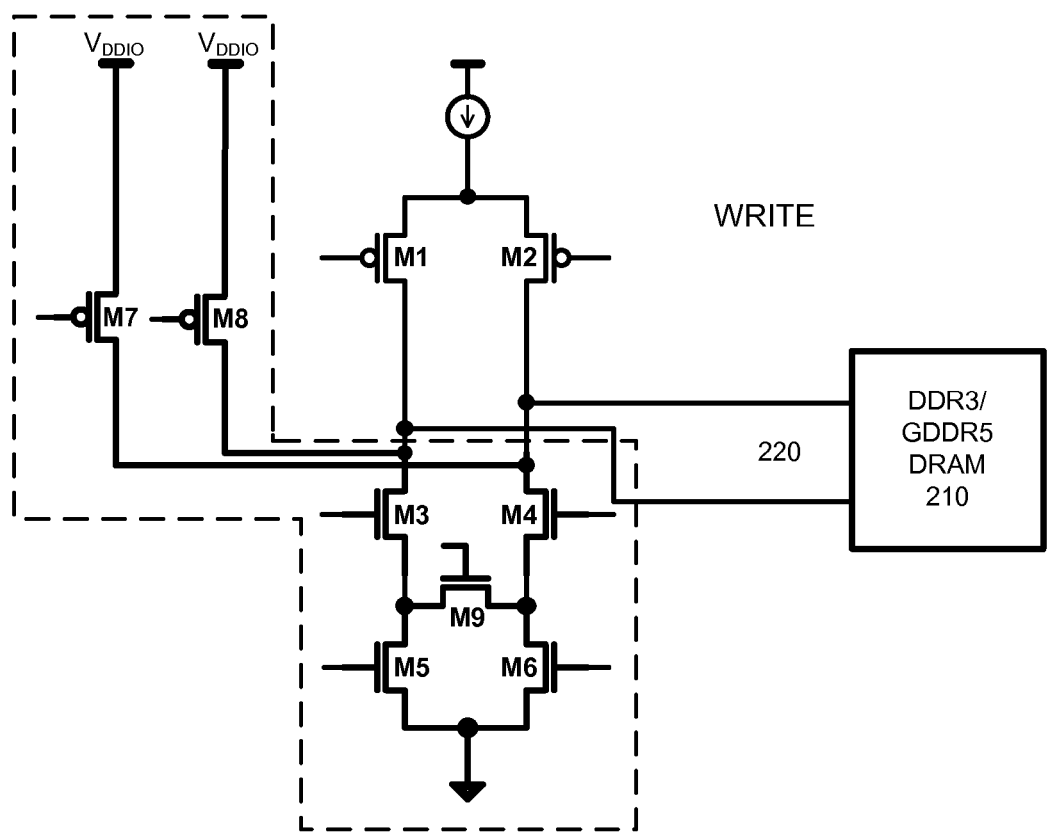
FIG. 2F illustrates the multi-modal circuitry with single-ended write circuitry highlighted in accordance with disclosed embodiments.
Figure 2G:
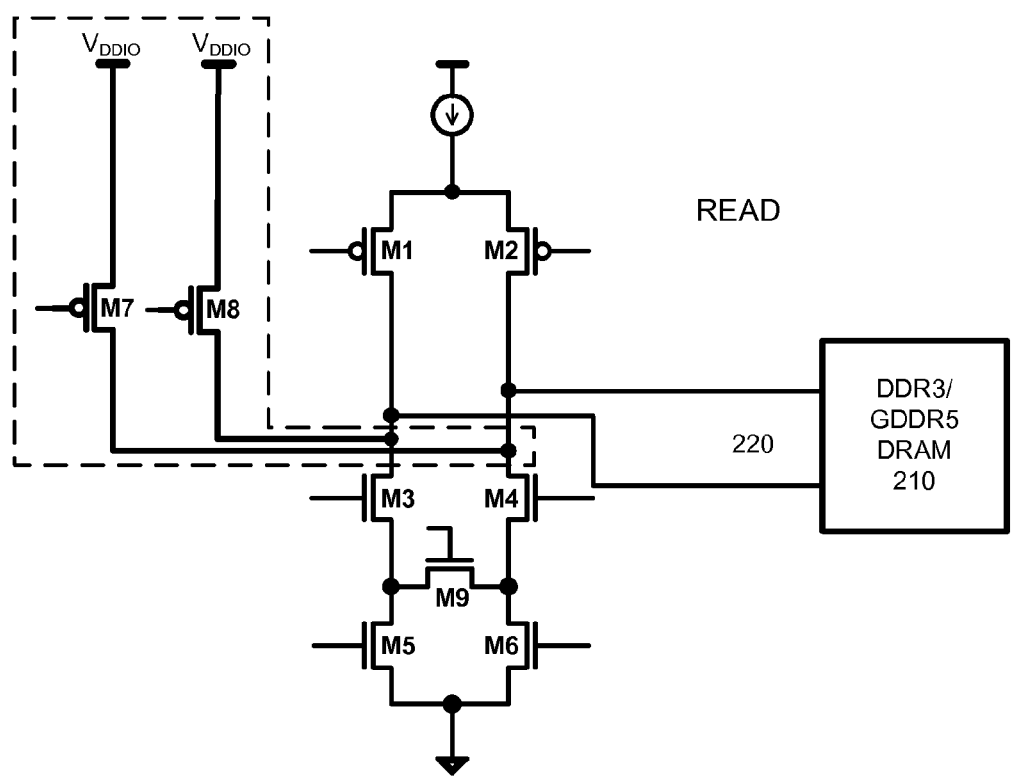
FIG. 2G illustrates the multi-modal circuitry with single-ended read circuitry highlighted in accordance with disclosed embodiments.

For a second type of system illustrated in FIGS. 2F and 2G, the circuitry performs single-ended voltage-mode write operations, wherein data is transferred from memory controller 110 to another memory device 210, and single-ended voltage-mode read operations, wherein data is transferred in the other direction from the other memory device 210 to memory controller 110. For example, the memory device 210 could be a standard DDR3 or GDDR5 DRAM. In the single-ended mode, the two wires 220 each carry an independent single-ended data stream.

More specifically, referring to FIG. 2F, during a single-ended voltage-mode write operation, P-type transistor M8 and N-type transistors M3 and M5 function as one single-ended voltage-mode driver, wherein N-type transistors M3 and M5 are collectively operating as a pull-down resistor. Similarly, P-type transistor M7 and N-type transistors M4 and M6 function as another single-ended voltage-mode driver, wherein N-type transistors M4 and M6 are collectively operating as a pull-down resistor.

Referring to FIG. 2G, during a single-ended voltage-mode read operation, transistors M7 and M8 are configured to provide termination to $V_{DDIO}$ for the two single-ended links in case of a PODL memory interface. Alternatively, transistors M3-M5 and M4-M6 can be configured to provide single-ended termination to ground. Transistors M7, M4, and M6 can be enabled to create SSTL termination to both $V_{DDIO}$ and ground. Similarly, transistors M8, M3, M5 can be enabled for the other single-ended data link.

Note that N-type transistors M3, M4, M5 and M6 have a dual use in this circuit: (1) They function as part of the single-ended voltage-mode driver associated with P-type transistors M7 and M8; and (2) They also function as part of the differential current-mode driver associated with P-type transistors M1 and M2. Also note that N-type transistors M3 and M4 have a third use because they additionally form part of a termination resistance for differential signals received from memory device 120 (as was described previously). By reusing circuit elements for the different types of interfaces, the disclosed embodiments reduce help the capacitive load relative to other designs, which can greatly improve high-speed signaling performance. Note that the pull-up and pull-down network may include multiple slices to implement voltage-mode equalization and impedance calibration, and further, that any of the depicted transistors may be supplemented or, depending on design, be replaced by one or more poly resistors to implement part of the impedance network. Furthermore, the architecture could include the associated control logic to enable or disable the slices and transistors for calibration and equalization control.

Different types of equalization operations can be applied for the different types of signaling. For example, the system can use current-mode equalization techniques during current-mode signaling operations during write operations between the controller and the memory. This can involve using any one of a number of known equalization techniques for current-mode signaling, for example, using those multiple slice techniques introduced above. The system can also use voltage-mode equalization techniques during read operations between the memory and the memory controller, using any one of a number of known equalization techniques for voltage-mode signaling, or using mixed current and voltage mode techniques. The system can also be modified to include any one of a number of known voltage-mode and current-mode impedance calibration techniques. Furthermore, the system can utilize well-known impedance calibration and equalization techniques during WRITE and READ communication with the $2^{nd}$ DRAM type (for example, GDDR5).

Multi-Modal Circuitry with Near-$V_{DD}$ Signaling

Figure 3:
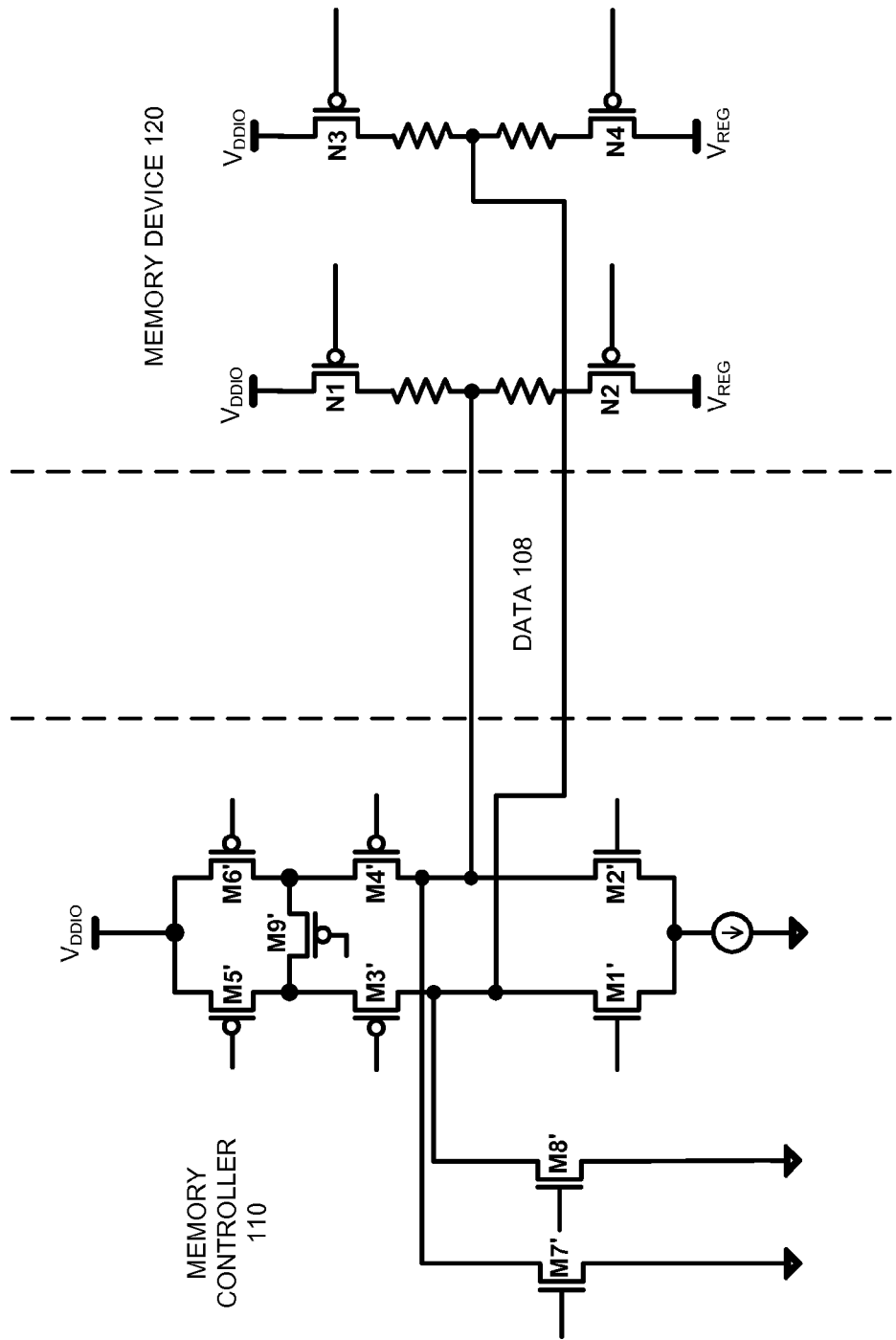
FIG. 3 illustrates multi-modal signaling circuitry in accordance with other embodiments.

FIG. 3 illustrates multi-modal signaling circuitry in accordance with another embodiment that provides near $V_{DD}$ signaling. This circuitry is similar to the circuitry illustrated in FIG. 2A, except that the circuitry on the side of the memory controller 110 has been flipped vertically between power and ground, and as a consequence some of the N-type transistors have been swapped with P-type transistors (and vice versa) and some of the pull-down transistors have become pull-up transistors. Note that the voltage at the memory controller 110 is unchanged and continues to go from $V_{DDIO}$ to ground. However, the voltage at memory device 120 is now between $V_{DDIO}$ and $V_{REG}$. This means that memory controller 110 and memory device 120 need to use the same supply voltage $V_{DDIO}$ to operate, which provides somewhat less flexibility to use different memory parts with different operating voltages. Otherwise, the circuitry is very similar, and circuit elements can similarly be shared among various voltage-mode and current-mode drivers and associated termination circuits.

Types of Systems

Figure 4A:
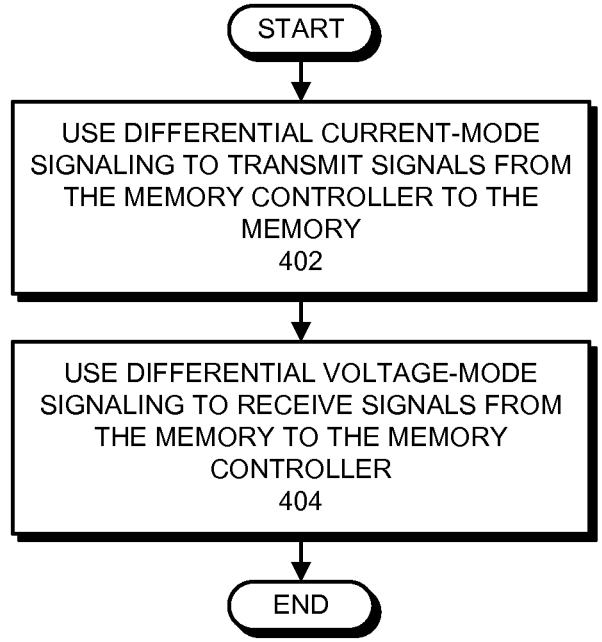
FIG. 4A presents a flow chart of the signaling process for a first type of system in accordance with disclosed embodiments.

FIG. 4A presents a flow chart that represents the signaling process for a first type of system in accordance with the disclosed embodiments. In this first type of system, the system uses differential current-mode signaling techniques to transmit signals from the memory controller to the memory (step 402). At the same time, the system uses differential voltage-mode signaling techniques to receive signals from the memory at the memory controller (step 404). The system is bimodal in the sense that communications follow multiple signaling methodologies.

Figure 4B:
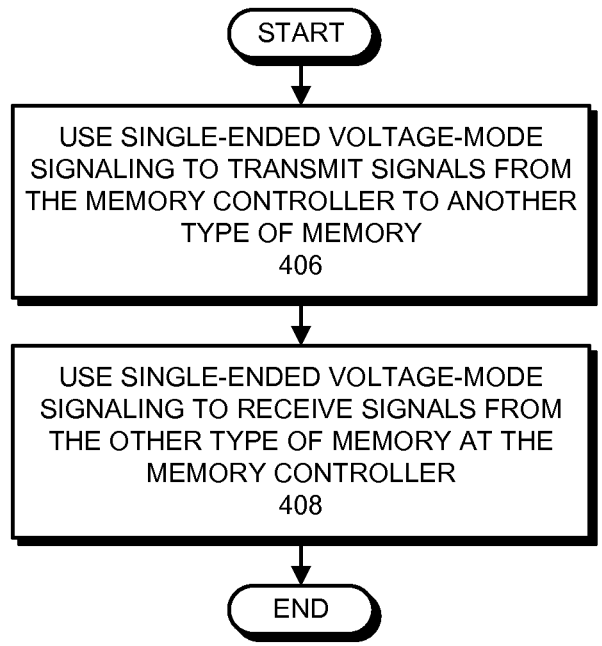
FIG. 4B presents a flow chart of the signaling process for a second type of system in accordance with disclosed embodiments.

In contrast to FIG. 4A, FIG. 4B presents a flow chart of the signaling process for a second type of system in accordance with the disclosed embodiments. In this second type of system, the system uses single-ended voltage-mode signaling to transmit signals from the memory controller to another type of memory (step 406). At the same time, the system uses single-ended voltage-mode signaling to receive signals from the memory at the memory controller (step 408). If a bimodal memory interface is used in this type of system (e.g., at the memory controller), the same interface design may be configured for use in either type of system.

Equalization

Figure 5:
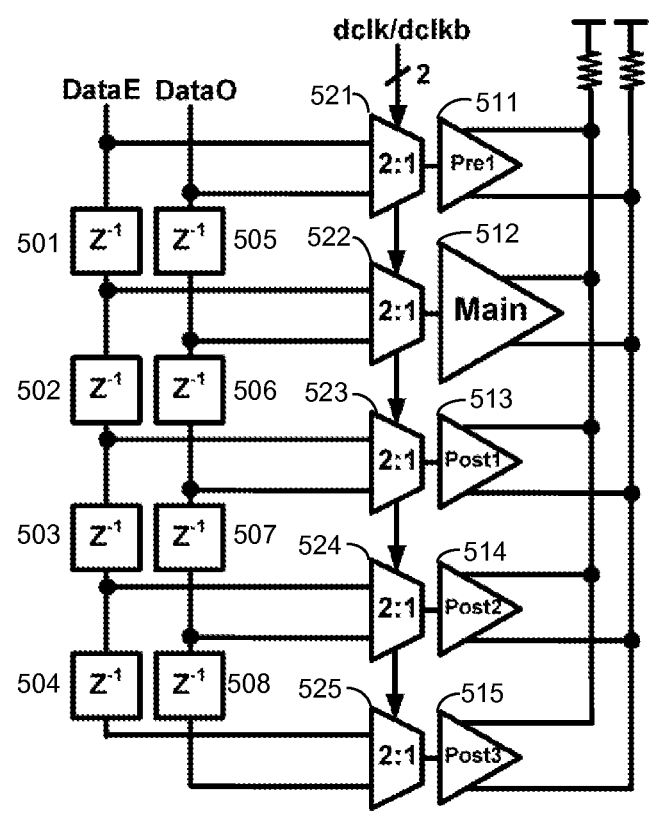
FIG. 5 illustrates equalization circuitry for a differential current-mode driver in accordance with disclosed embodiments.

The above-described circuits can be modified to provide equalization for the data transmissions, which can significantly reduce the error rate. For example, FIG. 5 illustrates equalization circuitry for a current-mode driver in accordance with the disclosed embodiments. As is illustrated in FIG. 5, even data (DataE) and odd data (DataO) feed through delay elements 501-508 to produce delayed versions of the even data and the odd data. Note that "even data" and "odd data" are standard components of a double-date rate (DDR) transmission, and that the each $Z^{-1}$ delay element (501-508) provides two clock cycles of delay. These delayed versions feed through MUXs 521-525, which alternately select even and odd data bits, and the selected data bits feed through differential drivers 511-515 which have different weights. The use of "even data" and "odd data" is flipped for successive taps—for example, if the main driver 512 is currently transmitting "even data," then pre1-tap differential driver 511 compensates for the immediately subsequent "odd data," post1-tap differential driver 513 compensates for the immediately previously transmitted "odd data," post2-tap differential driver 514 compensates for the immediately previously transmitted "even data," and post3-tap differential driver 515 compensates for the "odd data" that was transmitted 3-bits previous. The currents from differential drivers 511-515 are then summed together to produce the differential output. Different weights for the differential drivers can be tuned to effectively provide weighted taps on a delay line.

Figure 6A:
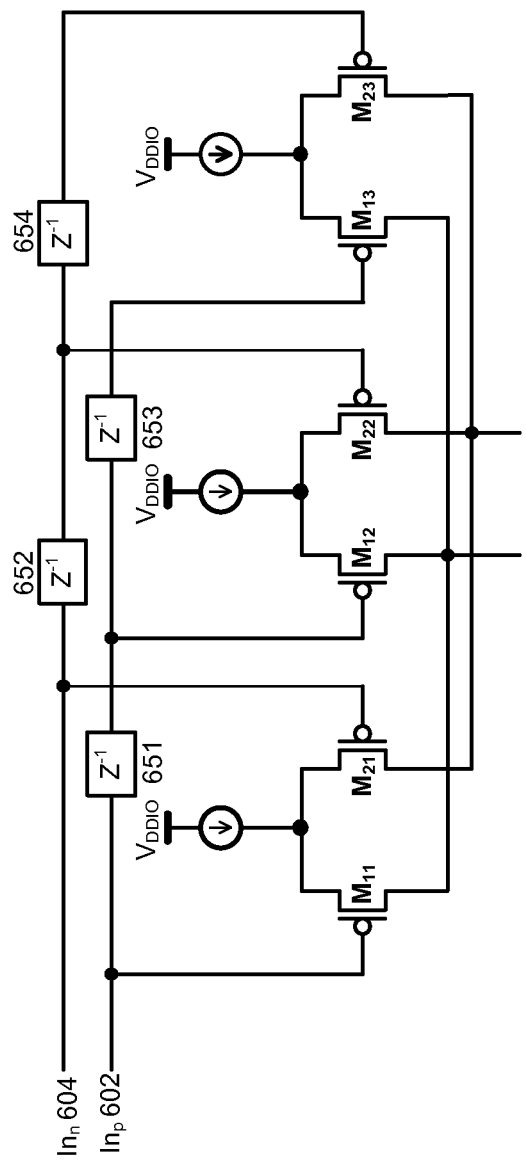
FIG. 6A provides a detailed illustration of equalization circuitry for a differential current-mode driver in accordance with disclosed embodiments.
Figure 6A:
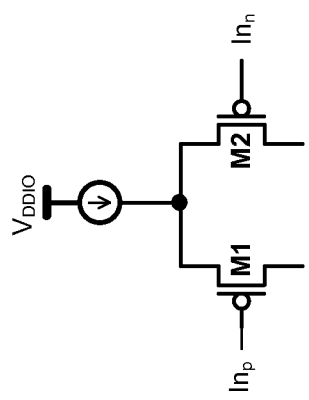

Another current-mode driver with equalization is illustrated in more detail in FIGS. 6A. Note that the implementation illustrated in FIGS. 6A includes only three slices, whereas the implementation illustrated in FIG. 5 contains five slices. The left-hand side of FIG. 6A illustrates a portion of the current-mode driver which comprises a current source and transistors M1 and M2. The right-hand side of FIG. 6A illustrates how this circuit can be "sliced" into three separate circuits which are connected through delay elements 651-654. The outputs of these three slices are connected together to form a "current sum" at the bottom of FIG. 6A. Once again, each $Z^{-1}$ delay element if implemented in a DDR system can provide two clock cycles of delay and represent either the even or odd "leg" of a DDR transmitter; alternatively, in a single data rate (SDR) system, each depicted leg can represent for example, a main driver, and post-1 and post-2 tap. Other configurations are also possible.

Figure 6B:
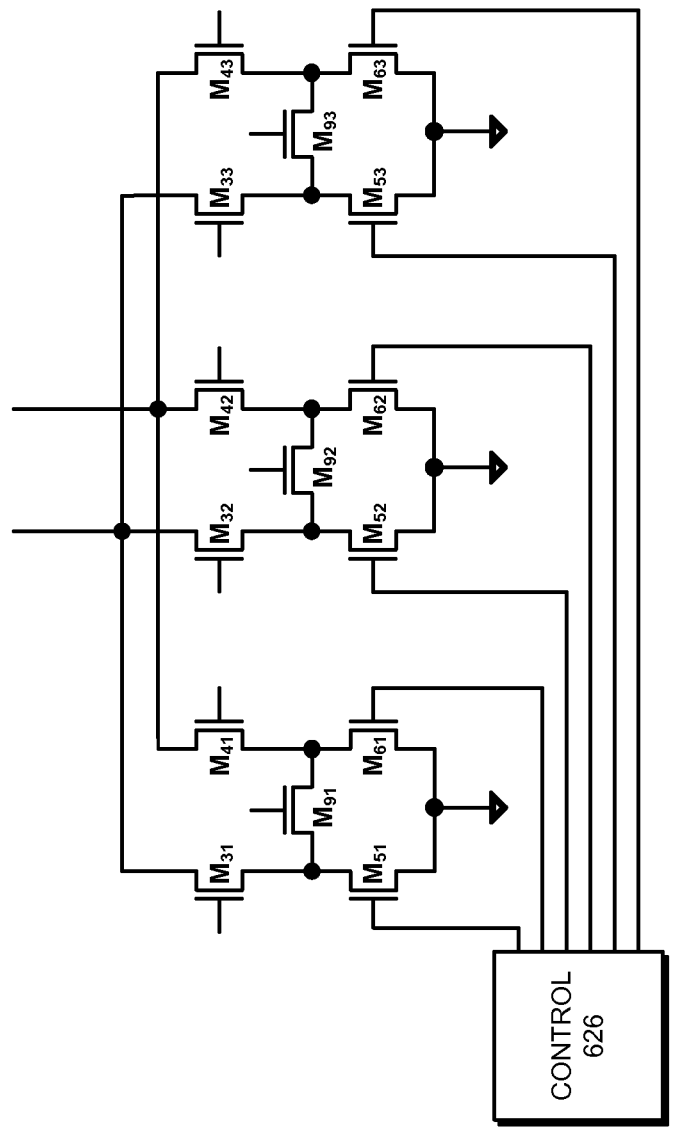
FIG. 6B provides a detailed illustration of impedance-calibration circuitry for a differential current-mode driver in accordance with disclosed embodiments.
Figure 6B:
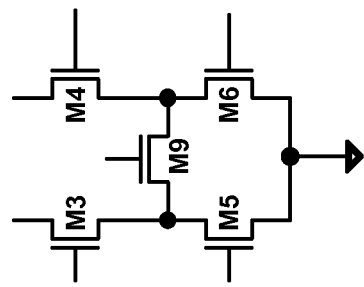

FIG. 6B illustrates impedance-calibration circuitry for a differential current-mode driver in accordance with the disclosed embodiments. The left-hand side of FIG. 6B illustrates terminations for the current mode driver, wherein the terminations comprise transistors M3, M4, M5, M6 and M9. The right-hand side of FIG. 6B illustrates how this circuit can be "sliced" into three separate circuits. Control circuit 626 is used to turn off or on different numbers of slices to facilitate the impedance calibration. Note that once again, adjustable impedance can be provided through digital control of multiple slices, operation of FETs in their Ohmic ranges, or using a combination of these techniques.

Figure 6C:
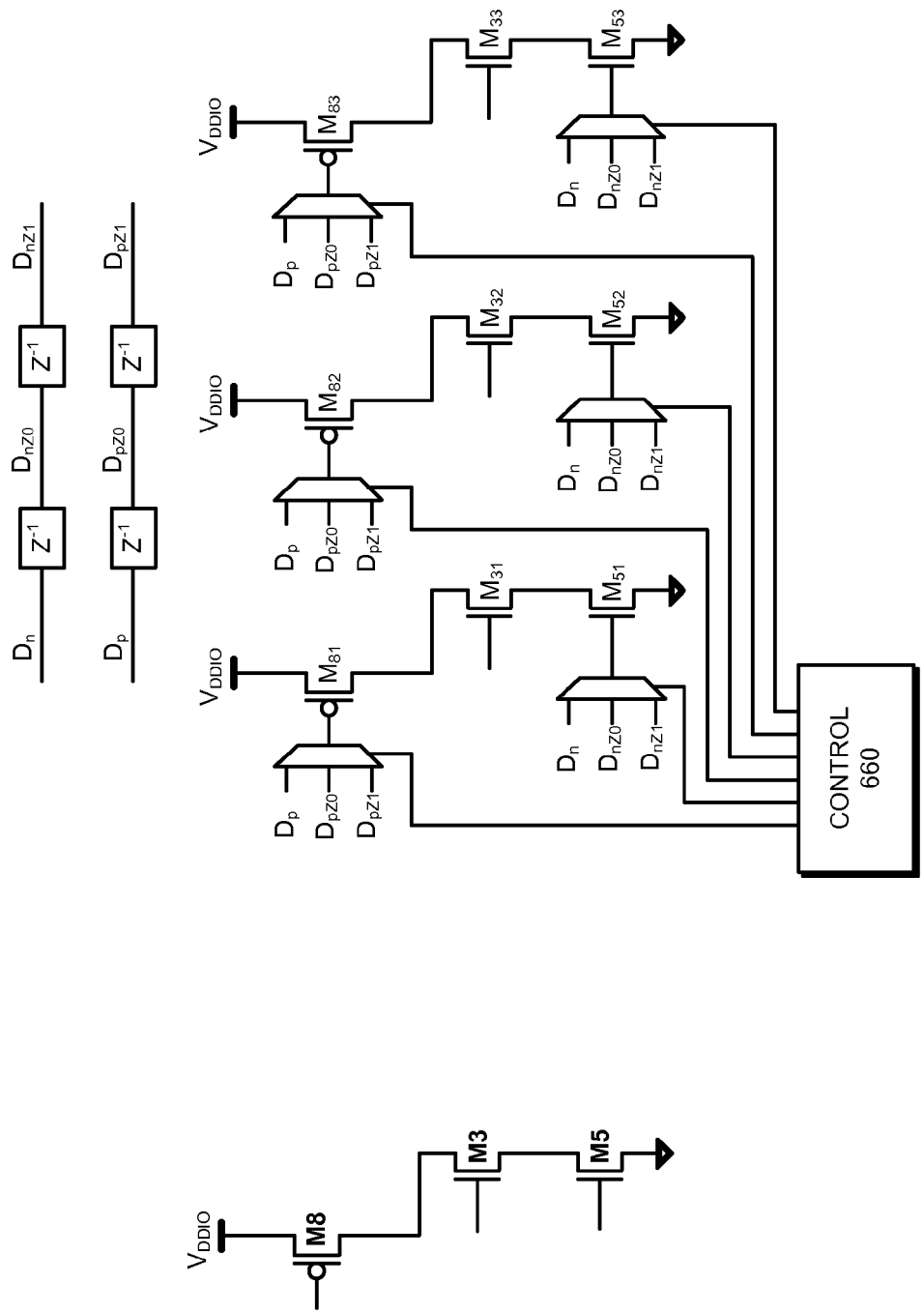
FIG. 6C illustrates voltage-mode equalization circuitry for a single-ended voltage-mode driver in accordance with disclosed embodiments.

FIG. 6C illustrates voltage-mode equalization circuitry for a single-ended voltage-mode driver in accordance with the disclosed embodiments. The left-hand side of FIG. 6C illustrates a voltage-mode driver, which comprises transistors M8, M3 and M5. The right-hand side of FIG. 6C illustrates how this circuit can be "sliced" into three separate circuits. Control circuit 660 is used to select different un-delayed versions ($D_p$ and $D_n$) and delayed versions ($D_{pZ0}$, $D_{pZ1}$, $D_{nZ0}$, and $D_{nZ1}$) of the input signals. This selection facilitates the equalization by effectively assigning different weights to the different delayed versions.

Figure 6D:
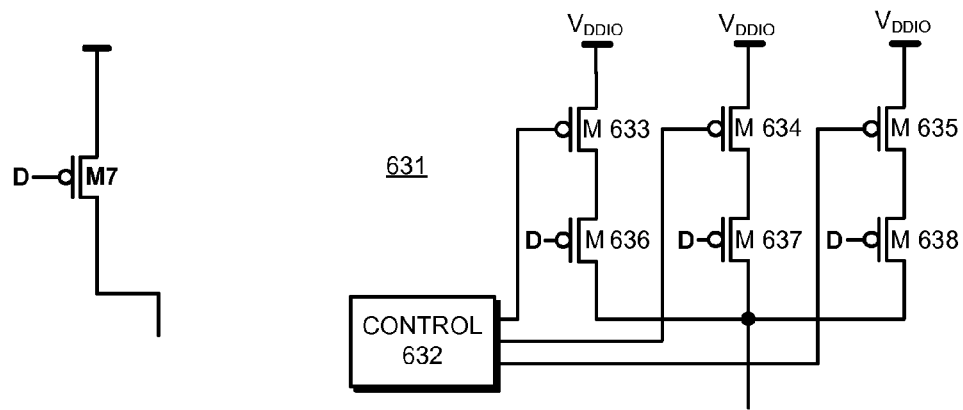
FIG. 6D illustrates impedance-calibration circuitry for a single-ended voltage-mode receiver in accordance with disclosed embodiments.

FIG. 6D illustrates impedance-calibration circuitry for a single-ended voltage-mode receiver in accordance with the disclosed embodiments. The left-hand side of FIG. 6D illustrates a termination for the voltage-mode receiver, wherein the termination comprises transistor M7. The right-hand side of FIG. 6D illustrates how this circuit can be "sliced" into three separate circuits. The control circuit 632 can be used to turn off or on different numbers of slices to facilitate the impedance calibration. Note that each slice from FIG. 6C (i.e., each tap) can comprise multiple "slices" each having the transistor structure seen in FIG. 6D. In this manner, each slice can be fine-tuned to provide desired equalization and/or impedance.

Figure 6E:
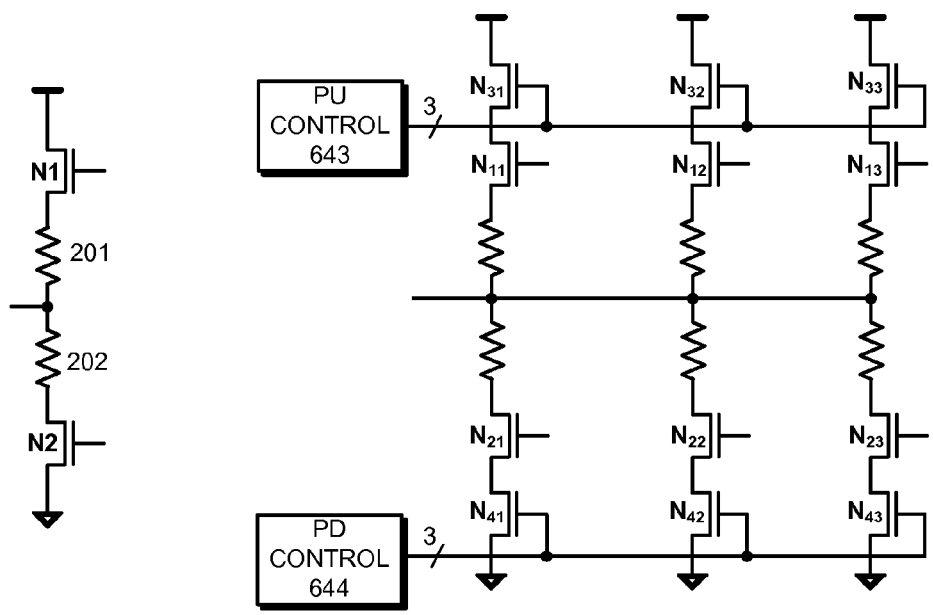
FIG. 6E illustrates impedance-calibration circuitry at the memory device in accordance with disclosed embodiments.

Finally, FIG. 6E illustrates equalization and impedance-calibration circuitry at the memory device side in accordance with the disclosed embodiments. The left-hand side of FIG. 6E illustrates a portion of the memory device side circuitry, which comprises transistors N1 and N2 and resistors 201 and 202. The right-hand side of FIG. 6E illustrates how this memory device side circuitry can be "sliced" into three separate circuits. Pull-up (PU) control circuit 643 and pull-down (PD) control circuit 644 can be used to turn off or on different numbers of slices to facilitate impedance calibration. Note that this FIG. is primarily directed toward showing impedance calibration; for equalization, multiplexers, such as 6C are also typically used and would be added to this FIG. Note also that there is no significant difference between calibration and impedance calibration for the controller in single-ended mode and the differential DRAM since the differential DRAM comprises of two single-ended drivers with complementary inputs.

The preceding description was presented to enable any person skilled in the art to make and use the disclosed embodiments, and is provided in the context of a particular application and its requirements.

Various modifications to the disclosed embodiments will be readily apparent to those skilled in the art, and the general principles defined herein may be applied to other embodiments and applications without departing from the spirit and scope of the disclosed embodiments. Thus, the disclosed embodiments are not limited to the embodiments shown, but are to be accorded the widest scope consistent with the principles and features disclosed herein. Accordingly, many modifications and variations will be apparent to practitioners skilled in the art. Additionally, the above disclosure is not intended to limit the present description. The scope of the present description is defined by the appended claims.

Also, some of the above-described methods and processes can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and apparatus described can be included in but are not limited to, application-specific integrated circuit (ASIC) chips, field-programmable gate arrays (FPGAs), and other programmable-logic devices.

What is claimed is:

1. A memory controller, comprising:
an integrated circuit (IC) chip;
an interface circuit formed on the IC chip to facilitate transferring data in connection with read and write operations between the memory controller and a memory via at least one signal path, wherein the memory includes one or more memory devices;
wherein the interface circuit includes a differential mode where the interface circuit is configured to provide, in connection with write operations,
a differential current-mode driver to transmit current-mode signals to the memory via the at least one signal path; and
wherein the interface circuit is configured to provide, connection with read operations,
a differential voltage-mode receiver to receive voltage-mode signals from the memory via the at least one signal path.

2. The memory controller of claim 1, wherein the differential current-mode driver and the differential voltage-mode receiver share at least one termination resistance to terminate differential voltage-mode signals received from the memory.

3. The memory controller of claim 1, wherein the interface circuit is configured to provide the differential current-mode driver to transmit signals to the memory and the differential voltage-mode receiver to receive signals from the memory during the differential mode, and wherein during a single-ended mode, the interface circuit is configured to provide:
a single-ended voltage-mode driver to transmit signals to the memory during the write operations; and
a single-ended voltage-mode receiver to receive signals from the memory during the read operations.

4. The memory controller of claim 3, wherein a first circuit to support the differential mode and a second circuit to support the single-ended mode share at least one termination.

5. The memory controller of claim 3, wherein:
the single-ended voltage-mode driver comprises first and second single-ended voltage mode drivers which share the first and second pull-down resistances with the differential current mode driver;
the first single-ended voltage mode driver comprises a third P-type transistor coupled between a controller supply voltage and the first pull-down resistance; and
the second single-ended voltage mode driver comprises a fourth P-type transistor coupled between the controller supply voltage and the second pull-down resistance.

6. The memory controller of claim 5, wherein:
the single-ended voltage mode receiver comprises first and second single-ended voltage mode receivers;
a termination for the first single-ended voltage mode receiver comprises at least one of, a termination to ground through the first pull-down resistance, or a termination to the controller supply voltage through the third P-type transistor; and
a termination for the second single-ended voltage mode receiver comprises at least one of, a termination to ground through the second pull-down resistance, or a termination to the controller supply voltage through the fourth P-type transistor.

7. The memory controller of claim 1, wherein:
the differential current-mode driver generates complementary first and second differential outputs;

the differential current-mode driver further comprises a first P-type transistor coupled between a current source and the first differential output and a second P-type transistor coupled between the current source and the second complementary differential output;
the first differential output is coupled to ground through a first pull-down resistance;
the second differential output is coupled to ground through a second pull-down resistance;
the differential voltage-mode receiver receives complementary first and second inputs; and
a termination for the differential voltage-mode receiver is coupled between the first and second inputs and comprises components of the first and second pull-down resistances.

8. The memory controller of claim 7, wherein the termination for the differential voltage-mode receiver comprises a component of the first pull-down resistance coupled in series with an additional resistance and a component of the second pull-down resistance.

9. The memory controller of claim 1, wherein:
the differential current-mode driver generates complementary first and second differential outputs;
the differential current-mode driver comprises a first N-type transistor coupled between the first differential output and an input of a current source and a second N-type transistor coupled between the second differential output and the input of the current source;
the first differential output is coupled through a first pull-up resistance to a controller supply voltage;
the second differential output is coupled through a second pull-up resistance to the controller supply voltage;
the differential voltage-mode receiver receives complementary first and second inputs, wherein a termination for the differential voltage-mode receiver is coupled between the complementary first and second inputs and comprises a component of the first pull-up resistance coupled in series with an additional resistance and a component of the second pull-up resistance.

10. The memory controller of claim 1, wherein the memory controller is to provide at least one from the group comprising current-mode equalization and voltage-mode equalization.

11. A memory device, comprising:
an integrated circuit (IC) chip;
a memory core formed in the IC chip;
an interface circuit formed on the IC chip to facilitate transferring data in connection with read and write operations between the memory device and a memory controller IC chip via at least one signal path, wherein the interface circuit includes a differential mode where the interface circuit is configured to provide, in connection with read operations,
a differential voltage-mode driver to drive a differential voltage-mode signal to the memory controller IC chip via the at least one signal path; and
wherein the interface circuit is configured to provide, in connection with write operations,
a differential current-mode receiver to receive a differential current-mode signal from the memory controller IC chip via the at least one signal path.

12. The memory device of claim 11, wherein:
the differential voltage-mode driver comprises complementary first and second drivers;
the first driver comprises a first N-type transistor in series with a first resistor between a device supply voltage and a first output and a second N-type transistor in series with a second resistor between ground and the first output;

the second driver comprises a third N-type transistor in series with a third resistor between the device supply voltage and a second output and a fourth N-type transistor in series with a fourth resistor between ground and the second output; and the differential current-mode receiver comprises a first input and a second input, the first input terminated to ground through the second N-type transistor in series with the second resistor, the second input is terminated to ground through the fourth N-type transistor in series with the fourth resistor.

13. The memory device of claim 11, wherein:

the differential voltage-mode driver comprises complementary first and second drivers;

the first driver comprises a first P-type transistor in series with a first resistor between a controller supply voltage and a first output and a second P-type transistor in series with a second resistor between a device supply voltage and the first output;

the second driver comprises a third P-type transistor in series with a third resistor between the controller supply voltage and a second output and a fourth P-type transistor in series with a fourth resistor between a device supply voltage and the second output; and the differential current-mode receiver comprises a first input and a second input, the first input terminated to the controller supply voltage through the first resistor in series with the first P-type transistor, the second input terminated to the controller supply voltage through the third resistor in series with the third P-type transistor.

14. The memory device of claim 11, wherein at least one resistance of the differential voltage-mode driver is shared with the differential current-mode receiver to terminate differential current-mode signals received from the memory controller IC chip.

15. The memory device of claim 11, wherein at least one component of the voltage-mode driver is configured to terminate single-ended voltage-mode signals received from the memory controller IC chip.

16. The memory device of claim 11, wherein the voltage-mode driver is to provide voltage-mode equalization during voltage-mode signaling operations.

17. A method for transferring data in connection with read and write operations between a memory controller integrated circuit (IC) chip and a memory IC chip, comprising:

using differential current-mode signaling during a differential mode to transmit current-mode signals from the memory controller integrated circuit (IC) chip to the memory IC chip in connection with write operations; and using differential voltage-mode signaling during the differential mode to receive voltage-mode signals from the memory IC chip at the memory controller integrated circuit (IC) chip in connection with read operations.

18. The method of claim 17, wherein using differential current-mode signaling to transmit signals from the memory controller integrated circuit (IC) chip to the memory IC chip and using differential voltage-mode signaling to receive signals from the memory IC chip at the memory controller integrated circuit (IC) chip are performed in association with a differential mode, and wherein the method further comprises, during a single-ended mode:

using single-ended voltage-mode signaling to transmit signals from the memory controller integrated circuit (IC) chip to the memory IC chip during write operations; and using single-ended voltage-mode signaling to receive signals from the memory IC chip at the memory controller integrated circuit (IC) chip during read operations.

19. A memory controller, comprising:

an integrated circuit (IC) chip;

a signaling path to couple to a memory device IC chip via at least one conductive path;

a transmitter configurable to transmit write data over the at least one conductive path using, in connection with one or more write operations, a selective one of current-mode differential communication over the at least one conductive path or single-ended voltage mode communication; and a receiver to, in connection with read operations, receive voltage-mode read data over the at least one conductive path.

20. The memory controller of claim 19, further comprising control logic including a register, the control logic to configure the transmitter for current-mode differential transmission responsive to a first value stored in the register, and for single-ended voltage mode transmission responsive to a second value stored in the register.

* * * * *